(12) United States Patent
Park et al.

(10) Patent No.: US 7,202,741 B2
(45) Date of Patent: Apr. 10, 2007

(54) HIGHLY LINEAR VARIABLE GAIN AMPLIFIER

(75) Inventors: Joonbae Park, Seoul (KR); Seung-Wook Lee, Seoul (KR); Jeong-Woo Lee, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 5 days.

(21) Appl. No.: 11/066,546

(22) Filed: Feb. 28, 2005

(65) Prior Publication Data

US 2006/0001489 A1    Jan. 5, 2006

Related U.S. Application Data

(60) Provisional application No. 60/551,788, filed on Mar. 11, 2004.

(51) Int. Cl.
*H03F 3/45*    (2006.01)

(52) U.S. Cl. .................................. 330/254; 330/279
(58) Field of Classification Search ............... 330/254, 330/278, 279, 124 R, 295
See application file for complete search history.

(56) References Cited

U.S. PATENT DOCUMENTS

| | | | |
|---|---|---|---|
| 5,327,098 A * | 7/1994 | Molina et al. | 330/254 |
| 5,429,105 A * | 7/1995 | Bennett et al. | 123/693 |
| 6,052,030 A * | 4/2000 | Garner et al. | 330/282 |
| 6,265,936 B1 * | 7/2001 | Heigl et al. | 330/51 |

* cited by examiner

*Primary Examiner*—Henry Choe
(74) *Attorney, Agent, or Firm*—The Fleshner Group PLLC (57) ABSTRACT

A variable-gain amplifier circuit uses a pair of single-ended operational amplifiers to amplify complementary portions of a differential input signal. By using two single-ended amplifiers instead of a single differential amplifier, linearity is significantly improved. In addition, common mode feedback circuitry is eliminated along with harmonic distortion and other forms of noise which tend to negative affect the quality of the signal output from the circuit.

33 Claims, 7 Drawing Sheets

HIGHLY LINEAR VARIABLE GAIN AMPLIFIER

This application claims the benefit of priority of U.S. Provisional Patent Application No. 60/551,788, filed Mar. 11, 2004, entitled HIGHLY LINEAR VARIABLE GAIN AMPLIFIER.

BACKGROUND OF THE INVENTION

1. Field of the Invention

The present invention generally relates to amplifying signals, and more particularly to a variable-gain amplifier and a method for controlling the same.

2. Background of the Related Art

Gain-controlled amplifiers are used in many wireless and wireline systems. In wireless applications, gain-controlled amplifiers which demonstrate a linear characteristic throughout a desired operational range are especially important for purposes of achieving a satisfactory level of performance.

Figure 1:
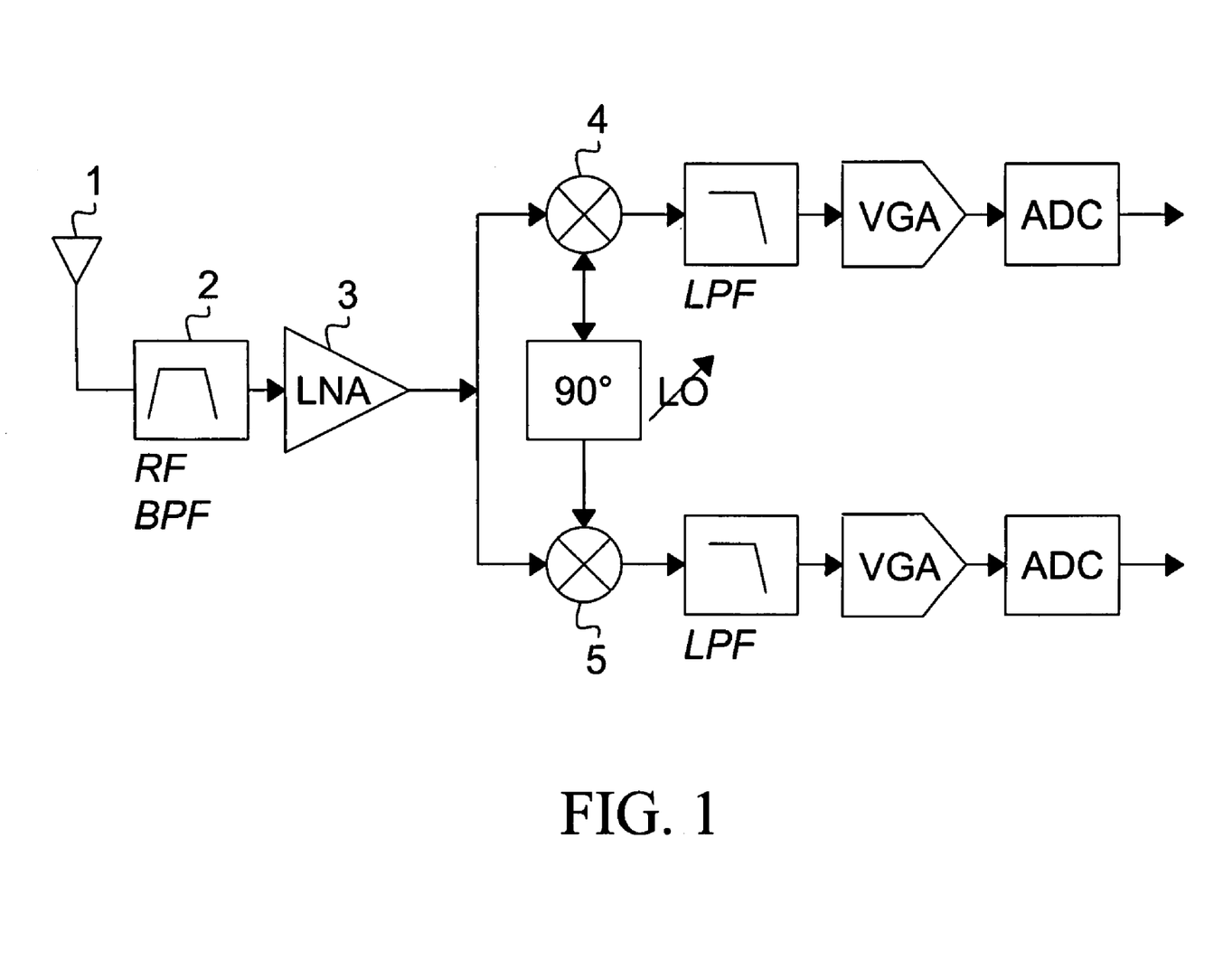
FIG. 1 shows a direct-conversion receiver.

FIG. 1 shows one wireless application in the form of a cellular communications receiver, which includes variable-gain amplifiers along its signal path. The receiver includes an antenna 1, an RF bandpass filter 2, and a low-noise amplifier 3. The signal output from the low-noise amplifier is combined, in mixers 4 and 5, with phase-shifted versions of an oscillator signal. In this receiver, the oscillator signal is set to the carrier frequency and thus baseband-signal recovery is performed using one conversion. (A receiver of this type is often referred to as a direct-conversion receiver.) The output of each mixer is passed through a low-pass filter LPF, amplified by a variable-gain amplifier VGA, and converted into a digital signal by an ADC converter. Subsequent signal processing steps are then performed.

In direct-conversion and other types of receivers, variable-gain amplifiers are used to suppress noise introduced into the baseband signal along the receiver signal path. The amount of noise suppression that takes place is typically proportional to the gain of the amplifier. When the received signal level is smaller than desired, the gain of the amplifier is increased. Conversely, when the received signal level is higher than desired, the gain of the amplifier is decreased. By adjusting the gain of the amplifier and accordingly the level of the baseband signal, excessive constraints on the dynamic range of subsequent stages of the receiver (including the analog-to-digital converter) can be avoided.

In wireless applications implemented using variable-gain amplifiers, increasing amplifier linearity is considered important for obtaining an acceptable signal-to-noise ratio. Unfortunately, when these amplifiers lack sufficient linearity, the desired signal is corrupted by inter-modulation caused by strong interfering signals.

Figure 2:
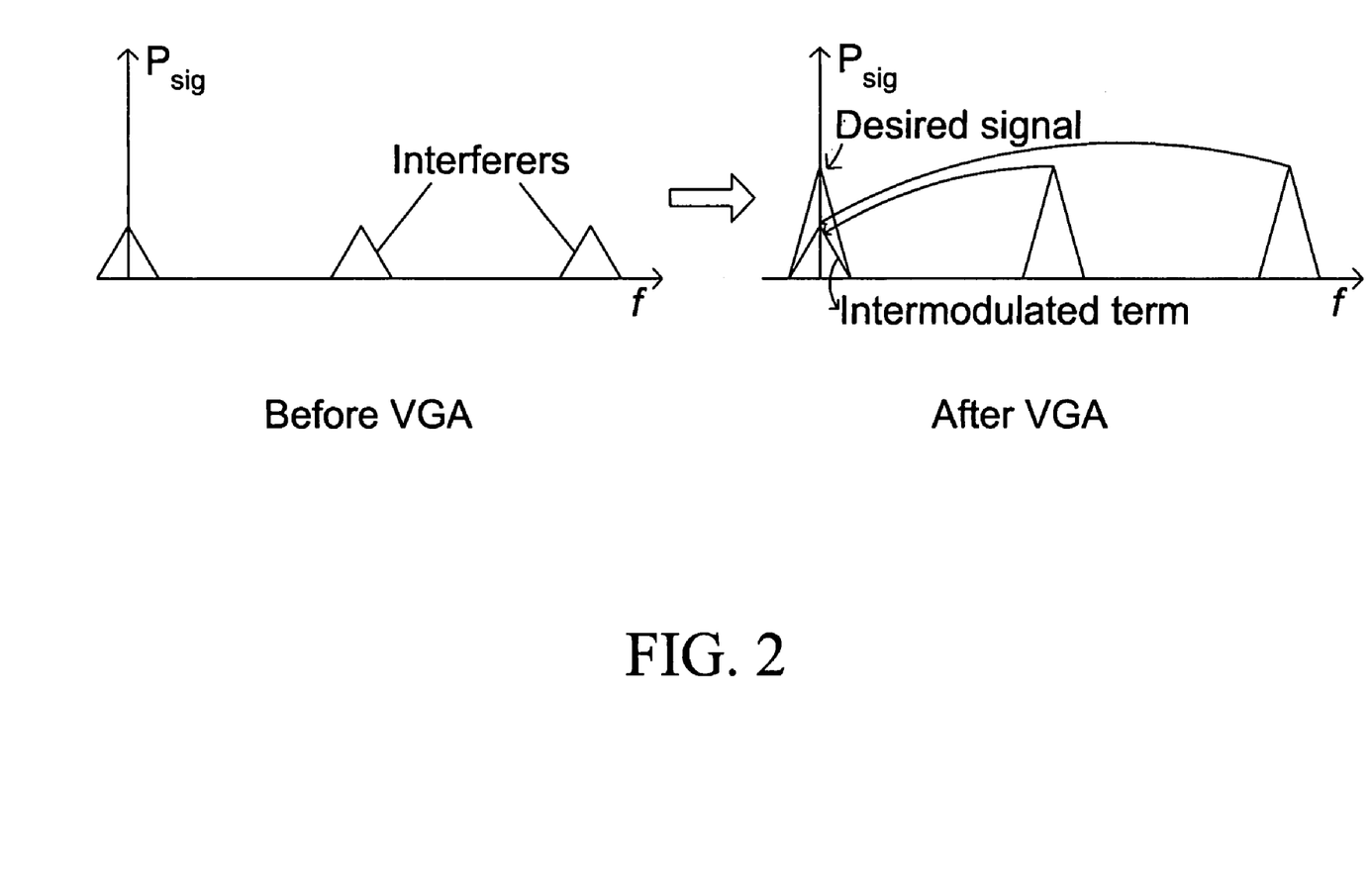
FIG. 2 shows input and output signal waveforms for a variable-gain amplifier under a first set of conditions.

FIG. 2 has two signal diagrams which show, by comparison, one way in which interference can affect the signals in a wireless application. The first signal diagram shows the state of a signal in a communications receiver such as shown in FIG. 1 prior to being input into one of the variable-gain amplifiers. This signal includes a desired signal and multiple interfering signals which have substantially the same amplitudes propagating along the signal path. When the desired and interfering signals have small magnitudes, the desired signal can be amplified to a desired level in spite of any linearities that may exist in the VGA. This is shown in the second signal diagram, where the amplitude of the desired signal is greater than the amplitudes of interfering terms generated by inter-modulation with the interfering signals. (In FIG. 2, $P_{sig}$ represents baseband signal power, which is shown to be triangular in shape and where the height of the triangle is directly proportional to the power).

Figure 3:
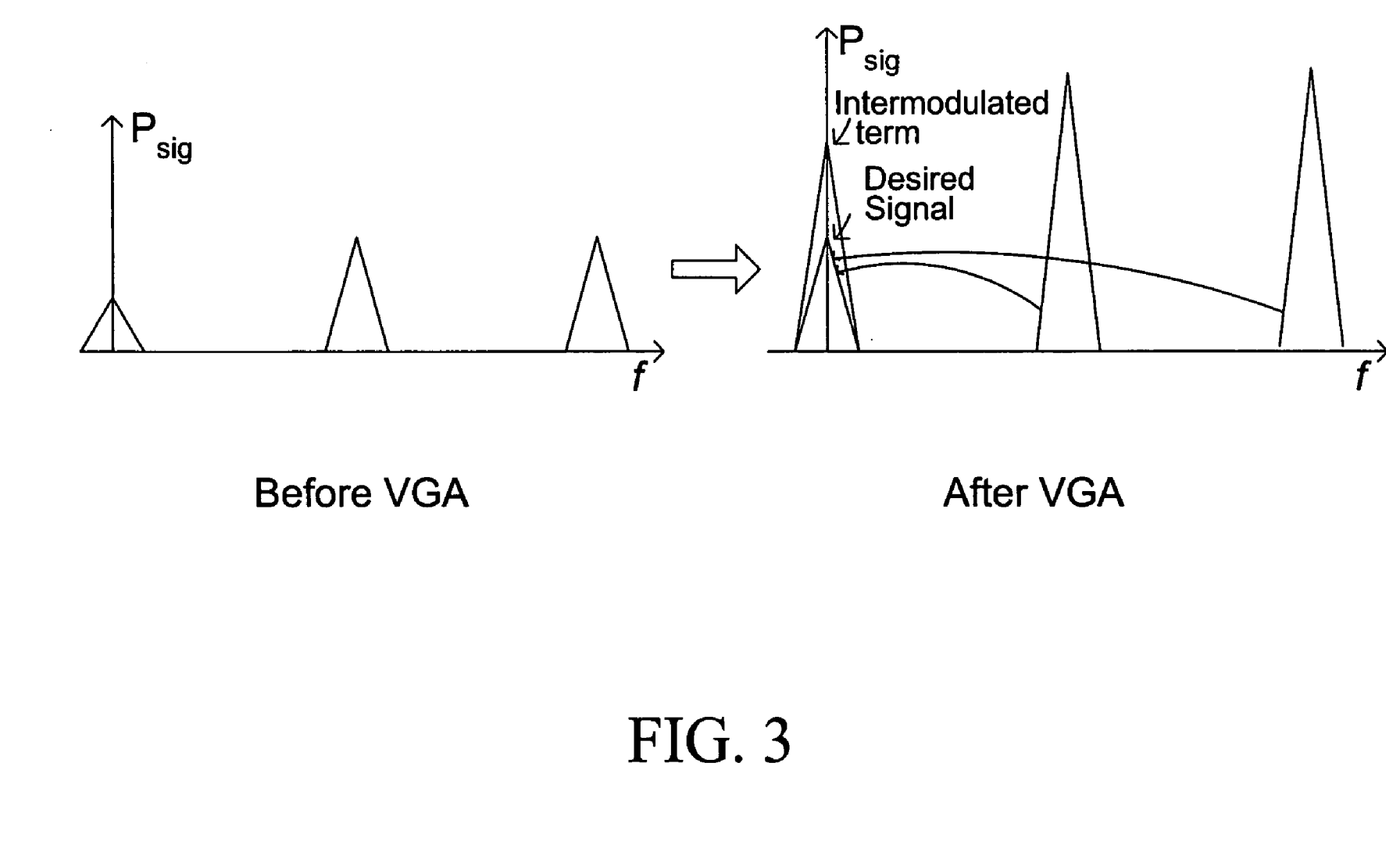
FIG. 3 shows input and output signal waveforms for a variable-gain amplifier under a second set of conditions.

FIG. 3 has two signal diagrams which show, by comparison, another way in which interference can affect the signals in a wireless application. The first signal diagram shows the state of a signal in a communications receiver such as shown in FIG. 1 prior to being input into one of the variable-gain amplifiers. However, unlike FIG. 2, the interfering signals have significantly larger amplitudes than the desired signal. Consequently, when amplified by a variable-gain amplifier having non-linear characteristics, the desired signal is seriously corrupted by noise terms generated from inter-modulation with the interfering signals. This is shown in the second diagram, where the amplitudes of the noise terms are much greater than the desired signal amplitude. If left uncompensated, this noise will propagate throughout the receiver to degrade the quality of the received signal.

Figure 4:
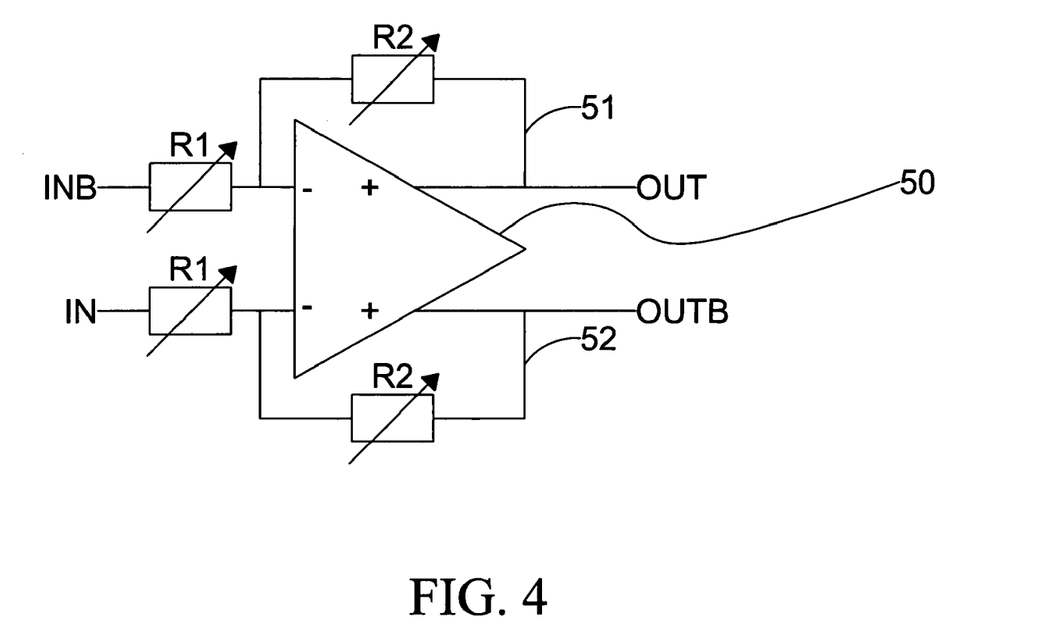
FIG. 4 shows one type of variable-gain amplifier which has been proposed.

FIG. 4 shows a variable-gain amplifier which has been proposed for use in a receiver. The amplifier is formed from a single differential amplifier 50 which includes two feedback paths 51 and 52, four resistors, and a virtual ground provided at the amplifier inputs. Resistors R1 are placed at the inverting and non-inverting terminals and resistors R2 are located along the feedback paths. The values of resistors R1 and R2 control the gain of the amplifier, i.e., changing the values of variable resistors R1 and R2 will result in setting the amplifier to a desired gain as indicated by the following equation:

$$V_{OUT} - V_{OUTB} = \frac{R_2}{R_1}(V_{IN} - V_{INB}) \qquad (1)$$

where $V_{out}$ and $V_{outB}$ are the differential output voltages of the amplifier, $V_{in}$ and $V_{inB}$ are the differential input voltages, and the ratio of $R_2$ and $R_1$ defines the gain.

Equation (1) defines the gain of the amplifier under ideal operational characteristics. In practice, however, the gain is not infinite and the amplifier suffers from secondary effects. For example, because the amplifier gain is not infinite, the input nodes of the amplifier will slightly track the input signal. The amount of fluctuation that occurs at the inputs depends on the gain and frequency characteristics of the amplifier.

Figure 5:
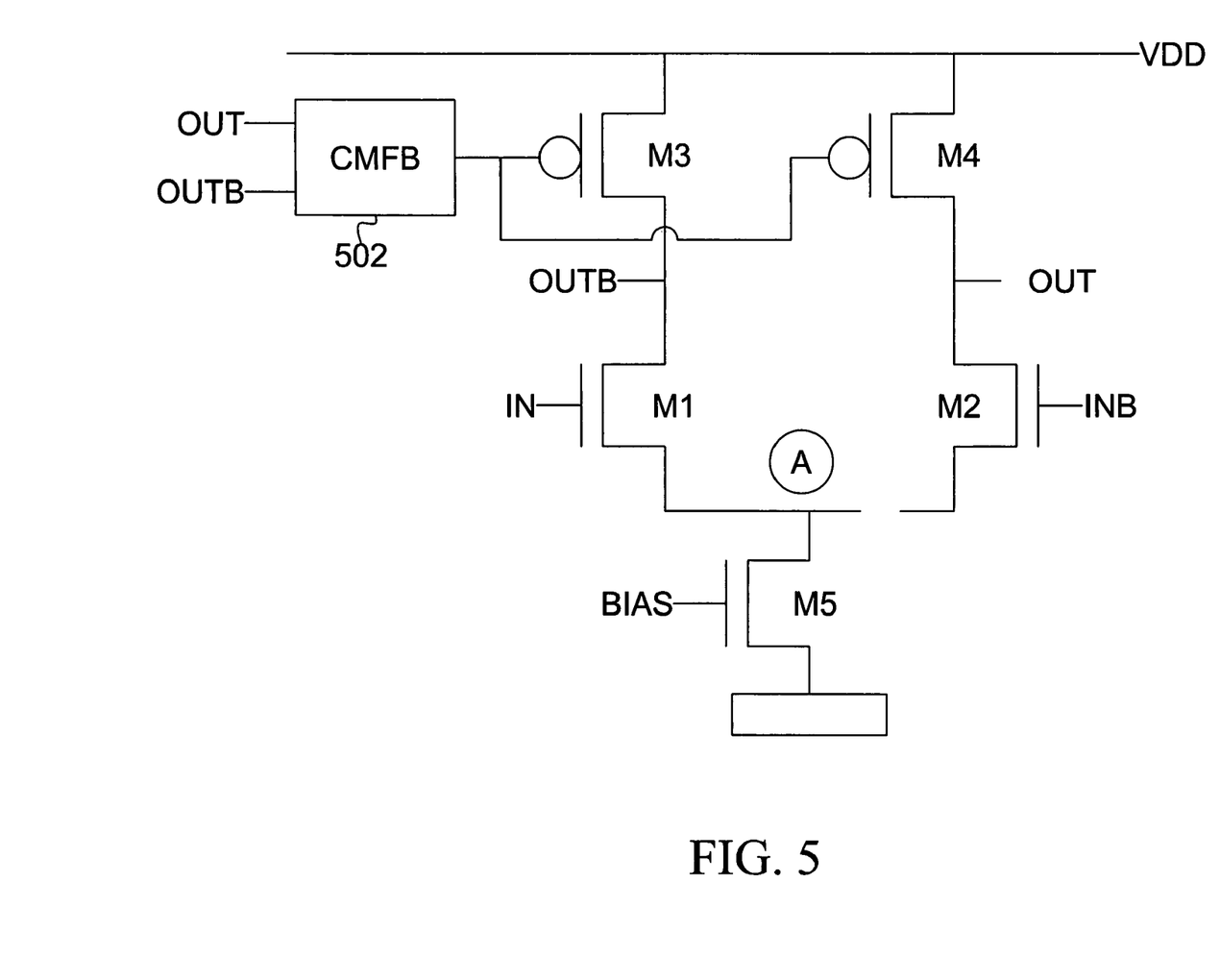
FIG. 5 shows a circuit diagram for the amplifier shown in FIG. 4.

FIG. 5 shows a block diagram of the operational transconductance amplifier of FIG. 4. As shown, this amplifier may be modeled using five transistors, where the gates of transistors M1 and M2 receive respective differential inputs IN and INB, the gates of transistors M3 and M4 receive a control signal from common mode feedback circuitry (CMFB), and transistor M5 is provided to set the bias current of the operational amplifier from the external bias circuitry not shown in FIG. 5. The common mode feedback circuit is used to stabilize the common mode output voltage of the two output signals, OUT and OUTB. Nodes N1 and N2 respectively disposed between transistor pair M1 and M3 and transistor pair M2 and M4 provide the differential output voltages OUT and OUTB of the amplifier. These voltages are fed back to the CMFB, where they are used to set the common mode output voltage of the two output signals. M1, M2, and M5 are NMOS transistors, M3 and M4 are PMOS transistors, and $V_{DD}$ is a supply voltage connected to the sources of transistors M3 and M4.

The non-linear properties of the amplifier are mostly attributable to the common source node (A) of the input transistors. More specifically, since the amplifier is usually designed to have very high gain at its input stage, small distortion at the input stage generates large distortion at the output stage. This large distortion results from the transient behavior node A experiences as a result of the two current signals flowing in the opposite directions (this opposing flow is explained in greater detail below). As a result, harmonics are generated at node A which alter the linear characteristics of the amplifier and thus generate the large distortion that occurs at the amplified output. The currents signals may be explained in greater detail as follows.

Since the two input signals, IN and INB, operate as a differential signal from the centered common mode signal, the two inputs signals can be expressed as follows:

$$V_{IN} = V_{CM} + \frac{V_D}{2}$$

$$V_{INB} = V_{CM} - \frac{V_D}{2}$$

where $V_{CM}$ is defined by the common mode feedback circuit. Thus, when the input voltage increases, the voltage of INB decreases. With this condition, the relative change of the current flowing into M1 and M2 transistors will have different polarity; that is, when the current in M1 increases the current in M2 decrease, and when the current in M1 decreases the current in M2 increases. The two current signals into the M1 and M2 transistors may therefore be said to flowing in opposite directions.

Another source of non-linearity in the amplifier of FIG. 5 is the common mode feedback circuitry. While this circuitry is beneficial for purposes of stabilizing the output levels of the amplifier, it produces mixed harmonics which cause distortions in the output signal.

SUMMARY OF THE INVENTION

An object of the present invention is to provide a variable-gain amplifier which has improved linearity characteristics compared with other types of amplifiers which have been proposed.

Another object of the present invention is to achieve the aforementioned object by reducing the generation of harmonics and other forms of noise that cause distortion in the amplifier output.

Another object of the present invention is to achieve one or more of the aforementioned objects by eliminating common source node connections that serve as a principal source of nonlinear distortion in other variable-gain amplifiers which have been proposed.

Another object of the present invention is to achieve one or more of the aforementioned objects by eliminating common mode feedback circuitry which also serves as a principal source of nonlinear distortion in other variable-gain amplifiers which have been proposed.

Another object of the present invention is to provide a communications receiver which uses the aforementioned variable-gain amplifier for baseband signal recovery, and/or to perform one or more other signal processing functions.

Another object of the present invention is to provide a communications receiver which includes a variable-gain amplifier as previously described.

Another object of the present invention is to provide a method for amplifying signals using a circuit which achieves one or more of the aforementioned objects.

These and other objects and advantages are achieved by providing a variable-gain amplifier circuit which according to one embodiment includes a first amplifier for amplifying a first input signal and a second amplifier for amplifying a second input signal. The first and second input signals are preferably different portions of a single differential input signal, and the first and second amplifiers output different portions of a same differential output signal.

The amplifier circuit may also include a first node for inputting the first input signal into the first amplifier and a second node for inputting the second input signal into the second amplifier, wherein current flow into the first and second nodes tracks each other to thereby reduce generation of harmonic components in the first and second input signals. Preferably, the direction of current flow into the first and second nodes is the same direction. Also, the first and second amplifiers are preferably single-output operational amplifiers.

The first amplifier may also include a non-inverting terminal which receives the first input signal and the second amplifier includes an inverting terminal which receives the second input signal. A first node connected to the inverting terminal of the first amplifier is also connected to an output of the first amplifier and the non-inverting terminal of the second amplifier. Resistive elements are preferably disposed along signal paths between the first node and the non-inverting terminal of the second amplifier and along a feedback signal path between the first node and the output of the first amplifier.

The amplifier circuit may also include a second node connected to the non-inverting terminal of the second amplifier, which is also connected to an output of the second amplifier and to the inverting terminal of the first amplifier. Resistive elements are preferably disposed along signal paths between the first and second nodes and along a feedback signal path between the second node and the output of the second amplifier.

Preferably, the first and second amplifiers are integrated to include a current mirror, a first transistor having a gate for receiving the first input signal, and a second transistor having a gate for receiving the second input signal. Sources of the first and second transistors are connected to form a common node and drains of the first and second transistors are connected to the current mirror. Complementary output nodes are respectively disposed between the current mirror and the first and second transistors.

The variable-gain amplifier of the present invention achieves improved linearity compared with other VGAs which have been proposed. These VGAs use a single differential operational amplifier which is non-ideal in terms of producing a linear characteristic and which also uses common mode feedback circuitry which has been shown to introduce noise into the amplifier output. The present invention overcomes these drawbacks by replacing the differential operational amplifier with two single-ended operational amplifiers, each of which is connected to receive a respective one of two differential input signals. Through this design, linearity is greatly improved and the use of common mode feedback circuitry can be avoided, both of which translate into improved signal quality in the amplifier output.

DETAILED DESCRIPTION OF PREFERRED EMBODIMENTS

Figure 6:
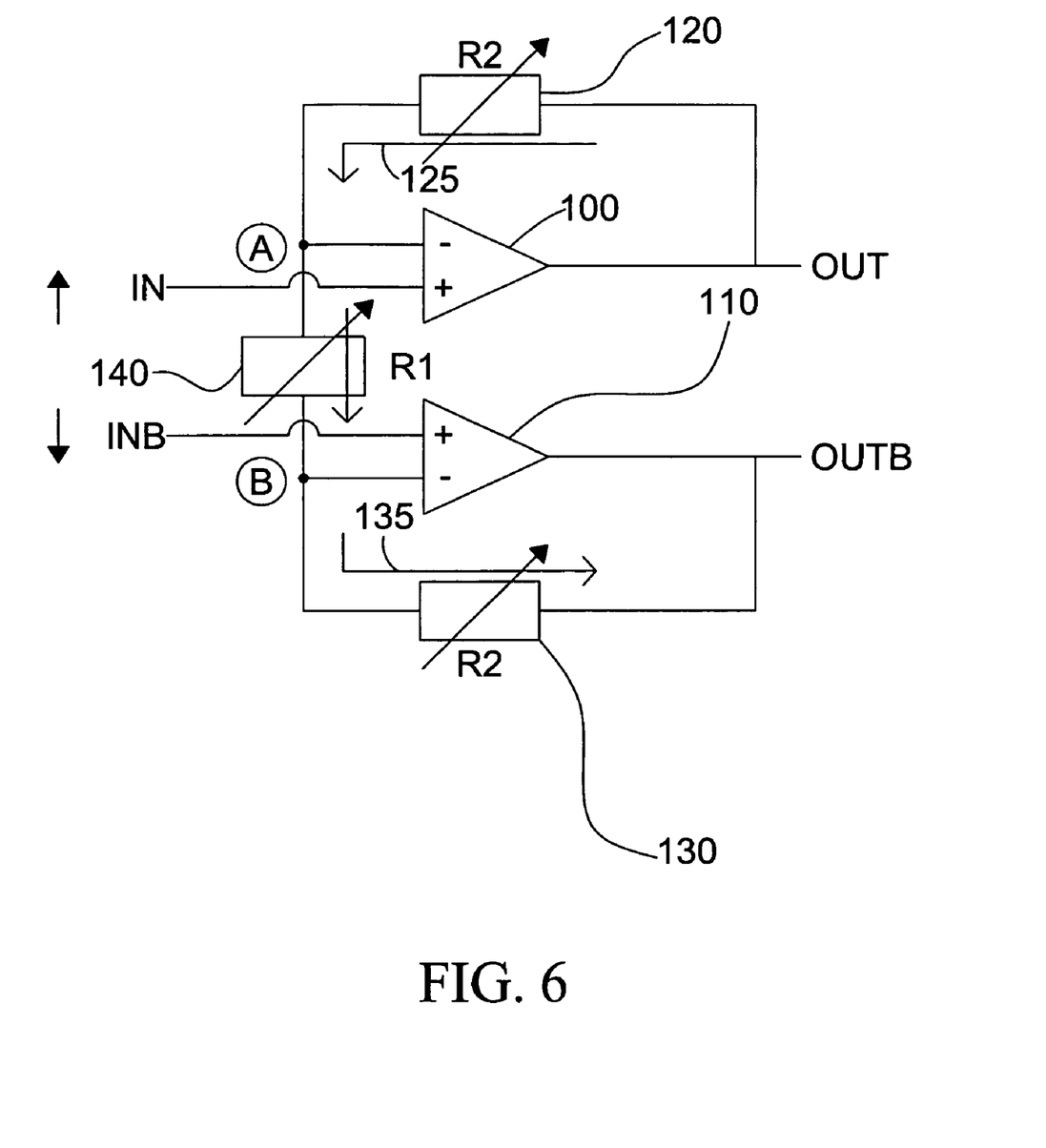
FIG. 6 shows a variable-gain amplifier in accordance with a preferred embodiment of the present invention.

FIG. 6 shows a variable-gain amplifier in accordance with a preferred embodiment of the present invention. This amplifier includes first and second single-ended operational amplifiers 100 and 110 and three variable resistors 120, 130, and 140. The non-inverting terminals of the first amplifier and second amplifiers are connected to receive differential input signals IN and INB respectively. The inverting terminal of the first amplifier is connected to the output OUT of amplifier 100 through a feedback path which includes resistor 120, and the inverting terminal of the second amplifier is connected to the output OUTB of amplifier 110 through a feedback path which includes resistor 130. Resistors 120 and 130 preferably have the same resistance values.

The non-inverting of the first amplifier and the non-inverting terminal of the second amplifier are coupled to one another through resistor 140, which is preferably different in value from the other two resistors. More specifically, as shown in FIG. 6, node A connects the non-inverting terminal of amplifier 100 to resistor 140 and the feedback signal output from resistor 120. Node B connects the inverting terminal of amplifier 110 to resistor 140 and the feedback signal output from resistor 130. In this arrangement, resistor 140 along with resistors 120 and 130 perform the gain function as indicated in Equation (2) discussed below.

The variable-gain amplifier of the present invention represents a significant improvement in the art. By using two single-ended operational amplifiers instead of one differential amplifier as shown in related-art FIG. 4, the present invention is able to achieve substantially better linearity characteristics. Also, because the amplifier of the invention is implemented without common mode feedback circuitry, the generation of harmonics and other forms of noise which introduces distortion and overall tends to degrade signal quality is significantly reduced. These benefits are explained in greater detail as follows.

A main cause of the non-linearity in related-art variable-gain amplifiers is that harmonic components introduced into the input signal are translated into large harmonic distortion in the output signal. The present invention reduces or altogether eliminates this problem by replacing the differential amplifier with two single-ended amplifiers. In this configuration, the direction of current flow in the two input nodes track each other and therefore a significant reduction in the generation of harmonic components at the amplifier input is realized. Arrows 125 and 135 are provided to show the directions of flow of the current signals input into the amplifier, i.e., these arrows show the current flow directions when the voltage of the IN signal increases and the voltage of the INB signal decreases.

Figure 7:
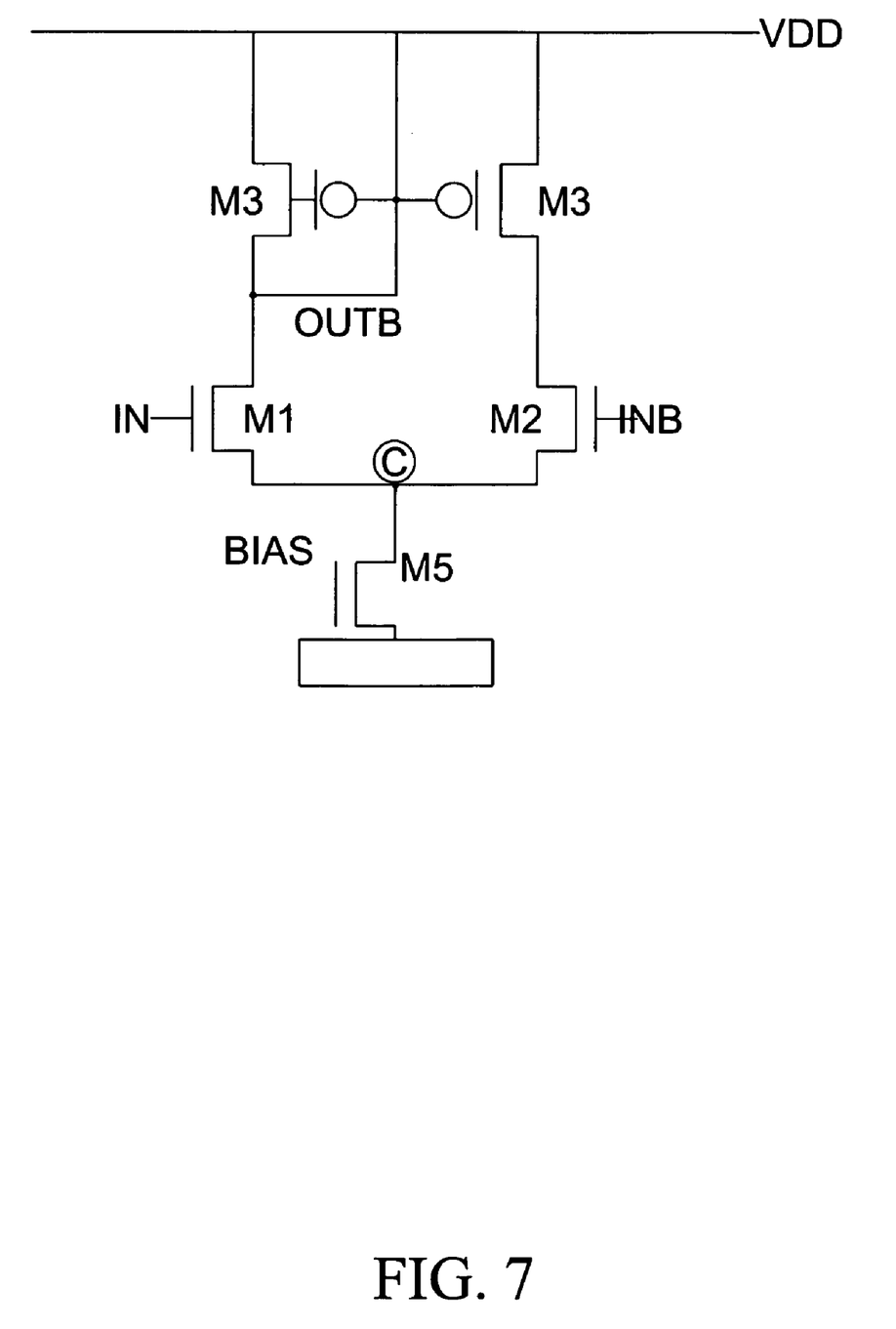
FIG. 7 shows a preferred circuit diagram of single-ended operational amplifiers included in the variable-gain amplifier of FIG. 6.

FIG. 7 shows a preferred circuit diagram of the single ended amplifiers used in FIG. 6. This diagram includes five transistors, three of which M1, M2, and M5 are preferably implemented in NMOS and the remaining two M3 and M4 in PMOS. The gates of transistors M1 and M2 are connected to receive differential input signals IN and INB. Assuming that the voltage of IN signal is larger than that of the NB signal, the voltage of the OUT signal will increase and the voltage of the OUTB signal will decrease. This is evident from the operating principles of the operational amplifier.

When the voltage at the IN node increases, the current flowing in the M1 transistor increases. Then, this current is sourced into the OUT node by the current mirror formed by coupled transistors M3 and M4. This operation is applied to the operation of the variable-gain amplifier of the present invention.

More specifically, referring to FIG. 6, as the positive voltage input into the IN node increases, the signal from the OUT node increase. This increase in voltage from the OUT node, in turn, causes the voltage at node A (the complementary input node of amplifier 100) to increase by the feedback resistor 120. In controlling the voltage at node A and the voltage output from the OUT node, the ratio between resistors R1 and R2 sets the gain, for example, in the manner indicated in Equation (2).

The large gain of the operational amplifier enables the voltages at node A and the input node IN to become the same. Similarly, the voltages at node B and input node INB become the same. A steady-state condition is therefore reached in which the output voltage of the variable-gain amplifier may be expressed by the following equation:

$$V_{OUT} - V_{OUTB} = \frac{R_2}{R_1}(V_{IN} - V_{INB}) \quad (2)$$

A comparison of Equations (1) and (2) reveals that the gain of the variable-gain amplifier of the related are and the present invention may be the same. However, unlike the related-art amplifier, the two input nodes IN and INB of the amplifier of the present invention track one other and thus harmonic components generated at common source node C in FIG. 7 is minimized or altogether eliminated. As a result, harmonic distortion at the output nodes OUT and OUTB of the variable-gain amplifier of the present invention is greatly reduced.

Another advantage of the variable-gain amplifier of the present invention is that it does not require common mode feedback circuitry. By comparison, in the amplifier of FIG. 4, the input common mode gain is very small, which means that any offset in the operational amplifier can cause large offset to occur at the output nodes of the VGA. This common gain is inversely proportional to the drain-source resistance of transistor M5 in FIG. 4, which is usually very large. Consequently, common gain is quite small.

In contrast, in the variable-gain amplifier of FIG. 6, the OUT signal has the same common mode voltage as the IN signal, and the OUTB signal has the same common mode voltage as the INB signal. This feature eliminates the necessity of using common mode feedback circuitry, which, in turn, translates into improved linearity characteristics of the variable-gain amplifier by removing the harmonic distortion that otherwise would have been generated by the common mode feedback circuitry.

The present invention is also a communications receiver which includes a variable-gain amplifier according to any of the embodiments described herein. Preferably, the receiver includes the variable-gain amplifier along a signal path of the front end of the receiver where baseband signal recovery takes place. In this configuration, the amplifier of the present invention may be connected to the output of one or more mixers used to recover the baseband signal from a received signal. The receiver may be a direct-conversion receiver having the same general architecture shown in FIG. 1, a superheterodyne receiver, or any other receiver configuration.

The foregoing embodiments and advantages are merely exemplary in nature and are not to be construed as limiting the present invention. The present teachings can be readily applied to other types of apparatuses. Moreover, the description of the present invention provided herein is intended to be illustrative and not to be limiting of the scope of the claims. Many alternatives, modifications, and variations will be apparent to those skilled in the art.

What is claimed is:

1. A variable-gain amplifier circuit, comprising:
a first amplifier for amplifying a first input signal;
a second amplifier for amplifying a second input signal, wherein the first and second input signals are different portions of a single differential input signal;
a first node for inputting the first input signal into the first amplifier; and
a second node for inputting the second input signal into the second amplifier,
wherein current flow into the first and second nodes tracks each other to thereby reduce generation of harmonic components in the first and second input signals.

2. The circuit of claim 1, wherein the direction of current flow into the first and second nodes is a same direction.

3. The circuit of claim 1, wherein the first and second amplifiers are single-output operational amplifiers.

4. A variable-gain amplifier circuit, comprising:
a first amplifier for amplifying a first input signal; and
a second amplifier for amplifying a second input signal, wherein the first and second input signals are different portions of a single differential input signal, wherein the first amplifier includes a non-inverting terminal which receives the first input signal and wherein the second amplifier includes an inverting terminal which receives the second input signal.

5. The circuit of claim 4, further comprising:
a first node connected to the inverting terminal of the first amplifier,
wherein the first node is connected to an output of the first amplifier and the non-inverting terminal of the second amplifier.

6. The circuit of claim 5, further comprising:
a resistive element connected along a signal path between the first node and the non-inverting terminal of the second amplifier.

7. The circuit of claim 5, further comprising:
a resistive element connected along a feedback signal path between the first node and the output of the first amplifier.

8. The circuit of claim 5, further comprising:
a second node connected to the non-inverting terminal of the second amplifier, wherein the second node is connected to an output of the second amplifier and to the inverting terminal of the first amplifier.

9. The circuit of claim 8, further comprising:
a resistive element connected along a signal path between the first node and the second node.

10. The circuit of claim 8, further comprising:
a resistive element connected along a feedback signal path between the second node and the output of the second amplifier.

11. The circuit of claim 8, further comprising:
a first resistor connected along a feedback signal path between the first node and the output of the first amplifier; and
a second resistor connecting along a feedback signal path between the second node and the output of the second amplifier, said first and second resistors having a same resistance value.

12. The circuit of claim 1, wherein the first and second amplifiers output different portions of a same differential output signal.

13. A variable-gain amplifier circuit, comprising:
a first amplifier for amplifying a first input signal; and
a second amplifier for amplifying a second input signal, wherein the first and second input signals are different portions of a single differential input signal, wherein the first and second amplifiers are integrated to include:
a current mirror;
a first transistor having a gate for receiving the first input signal;
a second transistor having a gate for receiving the second input signal,
wherein sources of the first and second transistors are connected to form a common node and drains of the first and second transistors are connected to the current mirror.

14. The circuit of claim 13, further comprising:
complementary output nodes respectively disposed between the current mirror and the first and second transistors.

15. The circuit of claim 1, wherein no common mode feedback circuitry is required for operation.

16. A method for performing signal amplification, comprising:
amplifying a first signal in a first amplifier; and
amplifying a second signal in a second amplifier, wherein the first and second signals are different portions of a single differential input signal and wherein current flow into an input node of the first amplifier tracks current flow into an input node of the second amplifier.

17. A method for performing signal amplification, comprising:
amplifying a first signal in a first amplifier; and
amplifying a second signal in a second amplifier, wherein the first and second signals are different portions of a single differential input signal, wherein current flow into an imput node of the first amplifier tracks current flow into an input node of the second amplifier, and wherein a direction of current flow into the input node of the first amplifier and a direction of current flow into the input node of the second amplifier are the same.

18. The method of claim 16, wherein the first and second amplifiers are single-output operational amplifiers.

19. A method for performing signal amplification, comprising:
amplifying a first signal in a first amplifier; and
amplifying a second signal in a second amplifier,
wherein the first and second signals are different portions of a single differential input signal and wherein the first signal is input into a non-inverting terminal of the first amplifier and the second signal in input into an inverting terminal of the second amplifier.

20. The method of claim 19, wherein a first node is connected to the inverting terminal of the first amplifier, an output of the first amplifier, and the non-inverting terminal of the second amplifier.

21. The method of claim 20, wherein a signal path between the first node and the non-inverting terminal of the second amplifier includes a resistive element.

22. The method of claim 20, wherein a second node is connected to the non-inverting terminal of the second amplifier, an output of the second amplifier, the inverting terminal of the first amplifier.

23. The method of claim 22, wherein a signal path between the first node and the second node includes a resistive element.

24. The method of claim 16, wherein the first and second amplifiers output different portions of a same differential output signal.

25. The method of claim 16, wherein signal amplification is performed without common mode feedback circuitry.

26. A communications receiver, comprising:
a mixer for recovering a baseband signal from a received signal; and
a variable-gain amplifier comprising:
(a) a first amplifier for amplifying a first input signal,
(b) a second amplifier for amplifying a second input signal, wherein the first and second input signals are different portions of a single differential input signal;
(c) a first node for inputting the first input signal into the first amplifier; and
(d) a second node for inputting the second input signal into the second amplifier, wherein current flow into the first and second nodes tracks each other to thereby reduce generation of harmonic components in the first and second input signals.

27. The receiver of claim 26, wherein the first and second amplifiers are single-output operational amplifiers.

28. The receiver of claim 26, wherein the first amplifier includes a non-inverting terminal which receives the first input signal and wherein the second amplifier includes an inverting terminal which receives the second input signal.

29. The receiver of claim 28, further comprising:
a first node connected to the inverting terminal of the first amplifier,
wherein the first node is connected to an output of the first amplifier and the non-inverting terminal of the second amplifier.

30. The receiver of claim 29, further comprising:
a resistive element connected along a signal path between the first node and the non-inverting terminal of the second amplifier.

31. The receiver of claim 29, further comprising:
a resistive element connected along a feedback signal path between the first node and the output of the first amplifier.

32. The receiver of claim 29, further comprising:
a second node connected to the non-inverting terminal of the second amplifier, wherein the second node is connected to an output of the second amplifier and to the inverting terminal of the first amplifier.

33. The receiver of claim 32, further comprising:
a first resistor connected along a feedback signal path between the first node and the output of the first amplifier; and
a second resistor connecting along a feedback signal path between the second node and the output of the second amplifier, said first and second resistors having a same resistance value.

* * * * *